United States Patent
Mosley

(10) Patent No.: US 6,724,611 B1
(45) Date of Patent: Apr. 20, 2004

(54) MULTI-LAYER CHIP CAPACITOR

(75) Inventor: Larry Eugene Mosley, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/537,274

(22) Filed: Mar. 29, 2000

(51) Int. Cl.[7] .................. H01G 4/228; H01G 4/236; H01G 4/06
(52) U.S. Cl. .................. 361/306.3; 361/307; 361/311
(58) Field of Search .................. 361/301.4, 302, 361/306.1–306.3, 307–309, 311–313, 320, 321.1–321.5, 328–330, 764

(56) References Cited

U.S. PATENT DOCUMENTS

| | | | |
|---|---|---|---|
| 4,328,530 A | 5/1982 | Bajorek et al. | 361/308 |
| 4,831,494 A | 5/1989 | Arnold et al. | 361/306 |
| 5,093,757 A * | 3/1992 | Kawakita et al. | 361/321 |
| 5,107,394 A * | 4/1992 | Naito et al. | 361/309 |
| 5,117,326 A * | 5/1992 | Sano et al. | 361/320 |
| 5,159,524 A * | 10/1992 | Hasegawa et al. | 361/271 |
| 5,369,545 A | 11/1994 | Bhattacharyya et al. | 361/306.2 |
| 5,471,363 A * | 11/1995 | Mihara | 361/305 |
| 5,512,353 A * | 4/1996 | Yokotani et al. | 428/210 |
| 5,530,288 A | 6/1996 | Stone | 257/700 |
| 5,679,980 A * | 10/1997 | Summerfelt | 257/751 |
| 5,696,018 A * | 12/1997 | Summerfelt et al. | 437/60 |
| 5,729,054 A * | 3/1998 | Summerfelt et al. | 257/751 |
| 5,745,335 A * | 4/1998 | Watt | 361/313 |
| 5,781,404 A * | 7/1998 | Summerfelt et al. | 361/321.5 |
| 5,793,057 A * | 8/1998 | Summerfelt | 257/55 |
| 5,811,851 A * | 9/1998 | Nishioka et al. | 257/310 |
| 5,910,881 A * | 6/1999 | Ueno | 361/313 |
| 5,972,053 A | 10/1999 | Hoffarth et al. | 29/25.03 |
| 5,973,910 A | 10/1999 | Gardner | 361/313 |
| 6,023,407 A | 2/2000 | Farooq et al. | 361/303 |
| 6,034,864 A | 3/2000 | Naito et al. | 361/306.1 |
| 6,037,044 A | 3/2000 | Giri et al. | 428/209 |
| 6,072,690 A | 6/2000 | Farooq et al. | 361/321.2 |
| 6,101,693 A * | 8/2000 | Kim et al. | 29/25.42 |
| 6,191,479 B1 | 2/2001 | Herrell et al. | 257/724 |
| 6,225,678 B1 * | 5/2001 | Yach et al. | 257/532 |
| 6,351,369 B1 * | 2/2002 | Kuroda et al. | 361/306.3 |
| 6,370,010 B1 * | 4/2002 | Kuroda et al. | 361/306.1 |

FOREIGN PATENT DOCUMENTS

EP 0917165 A2 5/1999 ............ H01G/4/30

OTHER PUBLICATIONS

"Capacitor for Multichip Modules", Jan. 1, 1978, IBM Technical Disclosure Bulletin, vol. 20, issue 8, pp. 3117–3118.*

* cited by examiner

Primary Examiner—Dean A. Reichard
Assistant Examiner—Eric Thomas
(74) Attorney, Agent, or Firm—Schwegman, Lundberg, Woessner & Kluth, P.A.

(57) ABSTRACT

An integrated circuit thin film capacitor includes multiple layers of conductors separated by dielectric material. The conductive layers are connected to interconnect lands using conductive vias. The interconnect lands can be controlled collapse chip connection (C4) lands that allow the capacitor to be connected to a circuit board. In one embodiment, the capacitor is mounted on a circuit board in close proximity to a processor circuit. The multi layer capacitor of the present invention provides the ability to increase a capacitance value while lowering interconnect resistance and inductance.

17 Claims, 5 Drawing Sheets

MULTI-LAYER CHIP CAPACITOR

TECHNICAL FIELD OF THE INVENTION

The present invention relates generally to capacitors and in particular the present invention relates to multi-layer integrated circuit capacitors.

BACKGROUND OF THE INVENTION

Integrated circuit devices operate using one or more power supplies. These power supplies traditionally have sufficient voltage and power to supply numerous circuits without interruption. Power supplies, however, have been decreasing in size. This forces the integrated circuit manufactures to decrease operating voltages and power requirements.

Under normal circumstances a power supply will be able to provide sufficient power to all circuits coupled to the supply. However, voltage drops on power supply lines can occur when there is a sudden increase in demand for power. This lower voltage can reduce switching times of the transistors in a circuit coupled to the supply. This in turn can cause a loss in performance of the circuit.

Decoupling capacitors can be provided in a circuit that is coupled to the power supply to minimize this voltage drop. That is, a decoupling capacitor stores a charge that helps stabilize changes in the voltage supply line. The response of these decoupling capacitors depends on the inductance and resistance of the capacitor and the amount of capacitance available. Fabricating decoupling capacitors in the same integrated circuit provides difficulty in obtaining sufficient capacitance for reliable decoupling.

An alternate approach is to provide numerous discrete capacitors external to a circuit package. These discrete capacitors are typically attached in parallel to a package, or circuit board. Physical space must be left between the capacitors for placement handling and soldering to the package. The spacing requires longer interconnect lines that results in higher inductance/resistance and less capacitance due to the wasted space and the terminal spacing on the capacitors. In addition the capacitors have edge, terminations that have higher inductance and resistance.

For the reasons stated above, and for other reasons stated below which will become apparent to those skilled in the art upon reading and understanding the present specification, there is a need in the art for a decoupling capacitor that has more capacitance while controlling resistance and inductance characteristics.

DETAILED DESCRIPTION OF THE INVENTION

In the following detailed description of embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention provides a multi layer thin film capacitor that can be used as a decoupling capacitor to stabilize a voltage provided by a power supply. The capacitor can be fabricated with inductance and resistance values typically seen only in thin film capacitors, but with the capability of obtaining a much higher capacitance. In one embodiment, the present invention provides a single discrete component that has a lower inductance and resistance due to increased contact locations on the capacitor body.

Many integrated circuits use a mounting technique based on controlled collapse chip connection (C4) sites. In the present invention, a large number of C4 sites decreases the resistance and the inductance of the capacitor because the current does not have to travel very far to reach a terminal. The C4 sites improve the performance of the capacitor as a decoupling capacitor. Techniques for mounting integrated circuits to circuit boards using C4 interconnects are well known in the art and a detailed description is not provided herein. The present invention allows a stand alone integrated circuit to be fabricated. Thus, real estate of an existing integrated circuit does not have to be sacrificed to include a relatively large decoupling capacitor.

Figure 1:
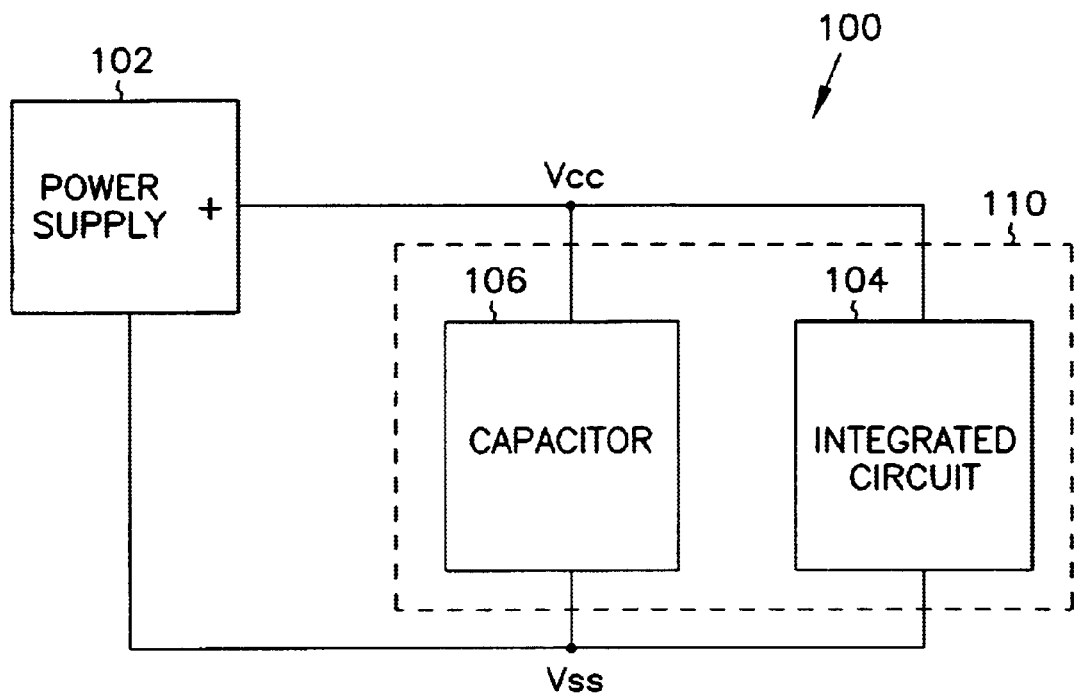
FIG. 1 illustrates a system of the present invention including a decoupling capacitor.

Referring to FIG. 1, a system 100 is generally illustrated that includes an integrated circuit 104, a power supply 102 and an external decoupling capacitor 106. The capacitor 106 is located external of the circuit 104 and fabricated as an integrated circuit device. In one embodiment, the capacitor is mounted on a circuit board 110, also called a package, physically adjacent to the circuit. The circuit board can be a mother board and circuit 104 can be a processor circuit. Both the circuit and the capacitor can be mounted to the package using C4 sites. In operation, the decoupling capacitor stores a charge on its plates. This charge is then used to provide power if the supply (Vcc) drops. It is understood that the capacitor will discharge if the supply voltage drops too far or for an extended period of time. The decoupling capacitor, therefore, is intended to assist in maintaining an adequate voltage supply for short periods where the voltage supply may dip.

Figure 2:
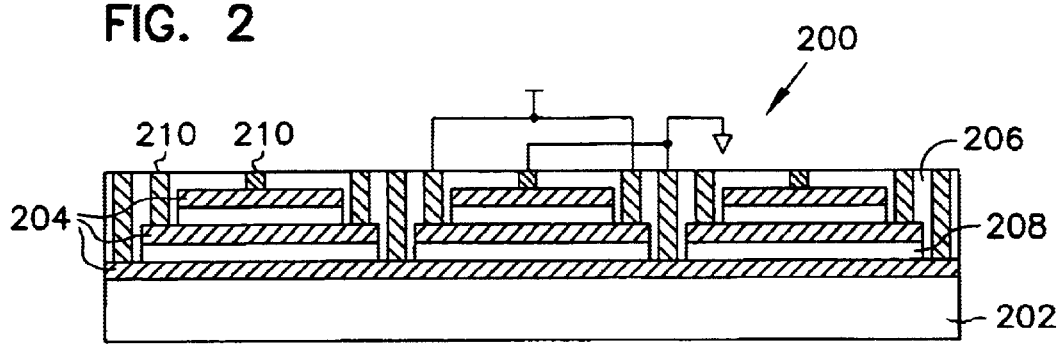
FIG. 2 illustrates a cross-section view of one embodiment of a capacitor according to the present invention.

FIG. 2 illustrates a cross-section of a capacitor of one embodiment of the present invention. The capacitor 200 is fabricated on a substrate 202. Numerous layers of conductor 204 material separated by dielectric 208 are fabricated over the substrate. The conductive layers can be fabricated from any conductive material, such as but not limited to aluminum, copper or a metal alloy. The dielectric layers can be fabricated from any suitable dielectric, such as but not limited to $BaSrTiO_3$ (referred to herein as BST).

The BST and metal layers can be fabricated in layered strips, and alternating conductive layers are connected together. In an alternate embodiment, the BST and metal layers can be fabricated as full layers. Electrical connections are illustrated in FIG. 2. It will be appreciated that the plates of the capacitor are interchangeable between Vcc and Vss connections of the power supply. The conductor and dielectric layers are covered with a dielectric material 206. This dielectric material can comprise, but is not limited to, the same material as dielectric layers 208. Vias 210 are fabricated through the dielectric material 206 to provide access to the conductive layers. The vias are then filled, or plated, with a conductive material to provide electrical interconnects to the conductive layers.

The number and size of the vias can be selected to reduce resistance of the capacitor interconnects and allow for C4 mounting to a package. The vias can be connected together in one of three ways. The first interconnect method includes fabricating conducting interconnects on a top surface of the capacitor. These interconnects can be conductive strips that run perpendicular to the conductive strip layers. A second embodiment provides interconnects on a package, or circuit board. The vias, therefore, are each coupled to the interconnects on the package. In a third embodiment, some of the vias are coupled using interconnect lines on the capacitor and some of the vias are coupled using interconnect lines on the circuit board. Independent of how the vias are connected, lands (pads) can be made on the top of the capacitor to form C4 connections to attach to the package substrate.

Figure 3:
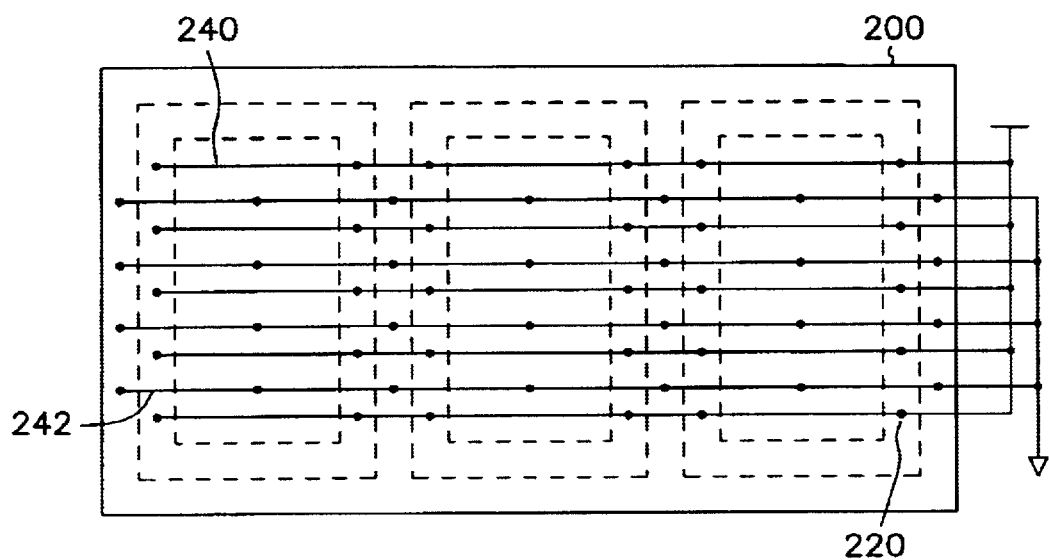
FIG. 3 illustrates a top view of one embodiment of a capacitor according to the present invention.

Referring to FIG. 3, a top-view, or plan view, of one embodiment of a capacitor is illustrated. The capacitor includes a plurality of C4 lands 220 located generally above the vias. The lands are staggered such that interconnect lines 240 and 242 connect to alternate conductive layers. The interconnect lines 240 and 242, in this embodiment are located on a circuit board that the capacitor mounts on.

Figure 4:
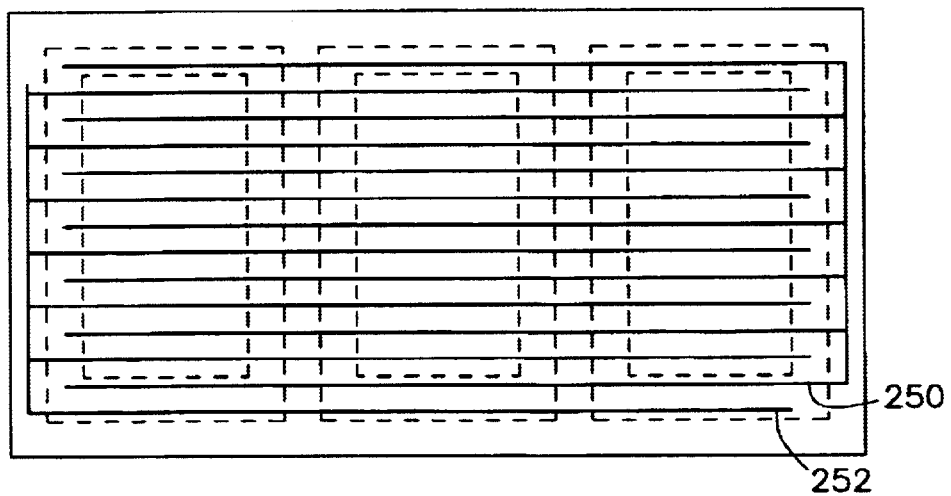
FIG. 4 illustrates a top view of one embodiment of a capacitor according to the present invention.

An alternate embodiment is illustrated in FIG. 4. In this embodiment, alternating interconnect lines 250 and 252 are fabricated on the top of the capacitor structure. The interconnect lines can include C4 lands to mount the capacitor to a circuit board. It will be appreciated by those in the art with the benefit of the present description that different interconnect patterns can be used with the present invention.

Figure 5:
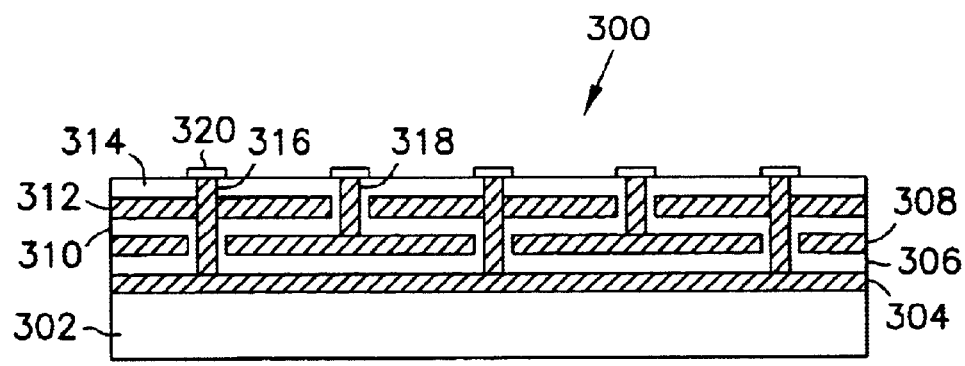
FIG. 5 illustrates a cross-section view of another embodiment of a capacitor according to the present invention.

Referring to FIG. 5, a cross-section of an alternate embodiment capacitor 300 is illustrated. While the embodiment of FIG. 2 included strips of conductors that formed a pyramid-shaped cross-section, the present embodiment can be fabricated with fill layers of conductors. The capacitor 300 includes a substrate 302. A first layer of conductor 304 is located over the substrate. An second conductive layer 308 is separated from the first conductor by dielectric layer 306. Likewise dielectric layers 310 and 314 surround a third conductive layer 312. First electrical vias 316 are used to connect the first and third conductive layers 304, 312. A clearance is provided in layer 308 to isolate the first electrical vias 316 from the second conductive layer 308. Second electrical vias 318 contact the second conductive layer 308. Clearance areas are provided in the first conductive layer 304 to isolate the second electrical vias 318 from the first conductive layer 304. C4 lands 320 can be provided to allow the capacitor 300 to be mounted to a circuit board. In this embodiment the conductive layers do not decrease in surface area as the number of layers increase.

It will be recognized by those skilled in the art that the present invention can include a variety of capacitor plates having different patterns. That is, the capacitor plates can be fabricated in different patterns to accommodate different C4 arrangements, and the present invention should not be limited to the layouts described herein.

Figure 6:
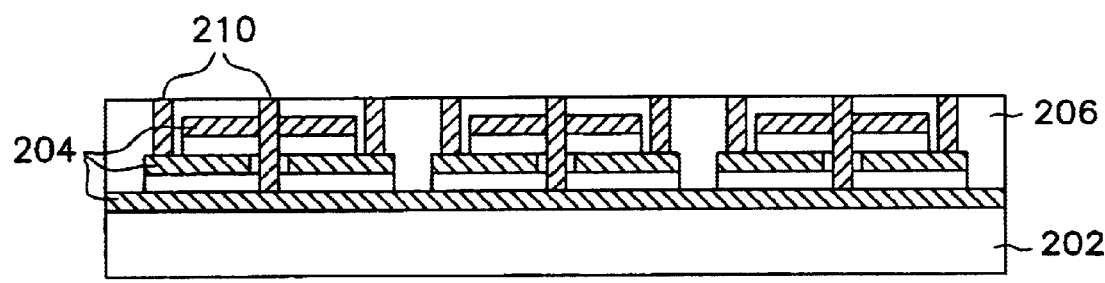
FIG. 6 illustrates a cross-section view of another embodiment of a capacitor according to the present invention.

In another embodiment illustrated in FIG. 6, the conductive layers are fabricated as described with reference to FIG. 2. In this embodiment, however, the interconnect vias pass through the second conductive layer to connect the first and third conductive layers using common vias. Again, a clearance area needs to be provided in the intermediate conductor to avoid shorts between the alternate conductor layers.

The present invention can be fabricated using known integrated circuit techniques. For example, the capacitor plates may be formed by any method, such as sputtering, chemical vapor deposition (CVD) or other deposition techniques. The top dielectric layer can be chemically/mechanically polished (CMP) to provide a planar surface for forming the C4 lands.

Figure 7:
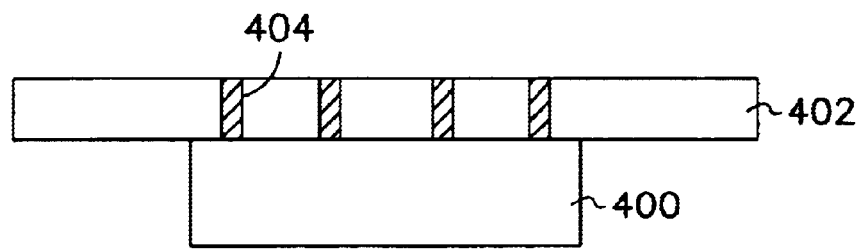
FIG. 7 illustrates an embedded capacitor embodiment according to one embodiment of the present invention.
Figure 8:
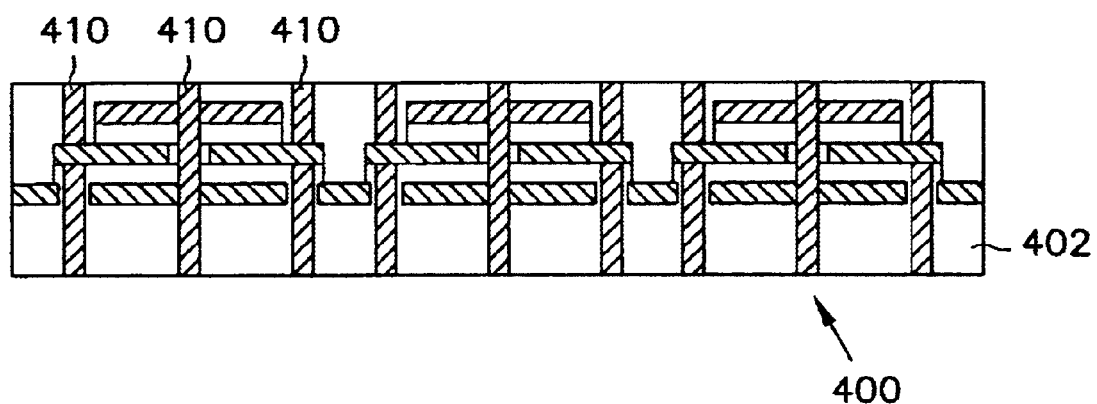
FIG. 8 illustrates a cross-section view of another embodiment of a capacitor according to the present invention.

FIG. 7 illustrates a cross section of an embedded capacitor embodiment comprising a capacitor 400 that is physically coupled to a dielectric layer 402. In one embodiment, the capacitor is attached to the dielectric using an adhesive. Vias 404 are then formed through the dielectric layer to expose electrical connections on the capacitor. The vias are then plated with a conductor to form an electrical interconnect to the capacitor. This embodiment, therefore, provides an alternate manner of coupling the capacitor to a circuit. FIG. 8 illustrates another embodiment of the present invention where electrical vias 410 are formed through the substrate 402 of the capacitor 400. The capacitor can be fabricated as explained herein, but with the additional electrical vias 410. These vias 410 allow circuits to be coupled to both sides of the capacitor and provided a more direct conductive path between the circuits.

Figure 9:
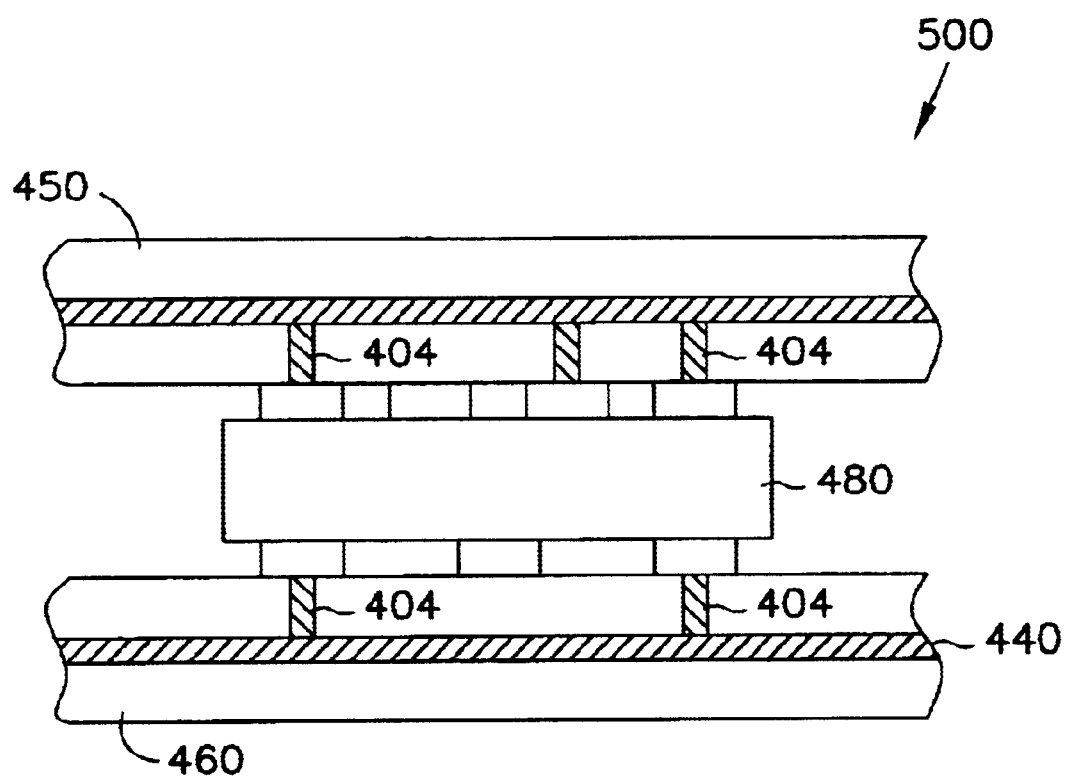
FIG. 9 illustrates an embedded capacitor package.

FIG. 9 illustrates an embedded capacitor package 500. The capacitor 480 includes interconnect lands on each side of the capacitor and can be fabricated as illustrated in FIG. 8. The capacitor has a first circuit package 450 formed on the top of the capacitor and a second package circuit 460 formed on the bottom of the capacitor. The packages have at least one conductive layer 440 and dielectric layers. The conductive layers are coupled using vias 404. These vias can be formed using a laser and plating the opening created with the laser. Other techniques can be used to fabricate and connect the package layers. The embodiment of FIG. 9, therefore, illustrates that the capacitor can be embedded in a multi-layer circuit package.

CONCLUSION

A thin film capacitor has been described that includes multiple layers of conductors separated by dielectric material. The conductive layers are connected to interconnect lands using conductive vias. The interconnect lands can be C4 lands that allow the capacitor to be connected to a circuit board. In one embodiment, the capacitor is mounted on a circuit board in close proximity to a processor circuit. The multi layer capacitor of the present invention provides the ability to increase a capacitance value while lowering interconnect resistance and inductance.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A multi layer integrated circuit capacitor comprising:
    a substrate;
    a first conductive layer located over and contacting the substrate;
    a first insulator layer located over and contacting the first conductive layer, the first insulator layer not contacting the substrate;
    a second conductive layer located over the first insulator layer;
    a second insulator layer located over the second conductive layer;
    a third conductive layer located over the second insulator layer;
    a third insulator layer located over the third conductor layer;
    a plurality of conductive vias downwardly extending through the third insulator layer to provide electrical interconnection to the first, second and third conductive layers; and a plurality of controlled collapse chip connection (C4) lands fabricated on and contacting the third insulator layer and in electrical contact with the plurality of conductive vias.

2. The multi layer integrated circuit capacitor of claim 1 wherein the C4 lands are fabricated in staggered columns in a plan view.

3. The multi layer integrated circuit capacitor of claim 1 wherein each of the conductive layers comprise a metal material and wherein each of the insulator layers comprise $BaSrTiO_3$.

4. A multi layer integrated circuit capacitor comprising:
    a substrate;
    a first conductive layer located over and contacting the substrate;
    a first insulator layer located over and contacting the first conductive layer, the first insulator layer not contacting the substrate;
    a second conductive layer located over the first insulator layer;
    a second insulator layer located over the second conductive layer;
    a third conductive layer located over the second insulator layer;
    a third insulator layer located over the third conductor layer;
    a plurality of conductive vias downwardly extending through the third insulator layer to provide electrical interconnection to the first, second and third conductive layers; and
    a fourth conductive layer located over the third insulator layer, the fourth conductive layer being patterned to form interconnect lines that selectively connect the plurality of conductive vias.

5. A multi layer integrated circuit capacitor comprising:
    a substrate;
    a first conductive layer located over and contacting the substrate;
    a first insulator layer located over and contacting the first conductive layer, the first insulator layer not contacting the substrate;
    a second conductive layer located over the first insulator layer;
    a second insulator layer located over the second conductive layer;
    a third conductive layer located over the second insulator layer;
    a third insulator layer located over the third conductor layer; and
    a plurality of conductive vias downwardly extending through the third insulator layer to provide electrical interconnection to the first, second and third conductive layers, wherein the second and third conductive layers are fabricated in a plurality of strips, such that a surface area of the second conductive layer is less than a surface area of the first conductive layer and a surface area of the third conductive layer is less than the surface area of the second conductive layer.

6. A multi layer integrated circuit capacitor comprising:
    a substrate;
    a first conductive layer located over and contacting the substrate;
    a first insulator layer located over and contacting the first conductive layer, the first insulator layer not contacting the substrate;
    a second conductive layer located over the first insulator layer, the second conductive layer being fabricated as a plurality of laterally spaced strips such that a surface area of the second conductive layer is less than a surface area of the first conductive layer;
    a second insulator layer located over the second conductive layer;
    a third conductive layer located over the second insulator layer, the third conductive layer being fabricated as a plurality of laterally spaced strips such that a surface area of the third conductive layer is less than the surface area of the second conductive layer;
    a third insulator layer located over the third conductive layer;
    a first plurality of conductive vias downwardly extending through the third insulator layer to provide electrical interconnection to the third conductive layer;
    a second plurality of conductive vias downwardly extending through the third insulator layer to provide electrical interconnection to the second conductive layer; and
    a third plurality of conductive vias downwardly extending through the third insulator layer to provide electrical interconnection to the first conductive layer.

7. The multi layer integrated circuit capacitor of claim 6 further comprising a fourth conductive layer located over the third insulator layer, the fourth conductive layer being patterned to form interconnect lines that selectively connect at least one of the pluralities of conductive vias.

8. A multi layer integrated circuit capacitor comprising:
    a substrate;
    a first conductive layer located over and contacting the substrate;
    a first insulator layer located over and contacting the first conductive layer, the first insulator layer not contacting the substrate;
    a second conductive layer located over the first insulator layer;
    a second insulator layer located over the second conductive layer;
    a third conductive layer located over the second insulator layer;
    a third insulator layer located over the third conductive layer;
    a first plurality of conductive vias downwardly extending through the third insulator layer, the third conductive layer, the second insulator layer, the second conductive layer and the first insulator layer to provide electrical interconnection to the first and third conductive layers; and a second plurality of conductive vias downwardly extending through the third insulator layer, the third conductive layer, and the second insulator layer to provide electrical interconnection to the second conductive layer.

9. The multi layer integrated circuit capacitor of claim 8 further comprising a fourth conductive layer located over the third insulator layer, the fourth conductive layer being patterned to form interconnect lines that selectively connect at least one of the pluralities of conductive vias.

10. The multi layer integrated circuit capacitor of claim 8 wherein at least one of the conductive layers comprise a metal material and wherein at least one of the insulator layers comprise $BaSrTiO_3$.

11. A circuit board assembly comprising:

a circuit board having a pair of supply voltage interconnect lines;

a first integrated circuit die mounted on the circuit board and electrically connected to the supply voltage interconnect lines; and a second integrated circuit die mounted on the circuit board and electrically connected to the supply voltage interconnect lines, the second integrated circuit die comprising a capacitor having:

a substrate;

a first conductive layer located over and contacting the substrate;

a first insulator layer located over and contacting the first conductive layer, the first insulator layer not contacting the substrate;

a second conductive layer located over the first insulator layer;

a second insulator layer located over the second conductive layer;

a third conductive layer located over the second insulator layer;

a third insulator layer located over the third conductive layer; and a plurality of conductive vias downwardly extending through the third insulator layer to provide electrical interconnection to the first, second and third conductive layers.

12. The circuit board assembly of claim 11 wherein the second integrated circuit die comprises a plurality of controlled collapse chip connection (C4) lands that are electrically connected to the plurality of conductive vias and the supply voltage interconnect lines.

13. The circuit board assembly of claim 11 wherein the first integrated circuit package is a processor circuit.

14. The circuit board assembly of claim 11 wherein at least one of the conductive layers comprise a metal material and wherein at least one of the insulator layers comprise $BaSrTiO_3$.

15. The circuit board assembly of claim 11 further comprising a fourth conductive layer located over the third insulator layer, the fourth conductive layer being patterned to form interconnect lines that selectively connect the plurality of plurality of conductive vias.

16. A multi layer integrated circuit capacitor comprising:

a substrate;

a first conductive layer located over and contacting the substrate;

a first insulator layer located over and contacting the first conductive layer, the first insulator layer not contacting the substrate;

a second conductive layer located over the first insulator layer;

a second insulator layer located over the second conductive layer;

a third conductive layer located over the second insulator layer;

a third insulator layer located over the third conductive layer; and a plurality of conductive vias downwardly extending through the third insulator layer to provide electrical interconnection to the first, second, and third conductive layers, the plurality of conductive vias further extending through the substrate to provide electrical interconnection to both a top surface and a bottom surface of the integrated circuit capacitor.

17. The multi layer integrated circuit capacitor of claim 16 further comprising a fourth conductive layer located over the third insulator layer, the fourth conductive layer being patterned to form interconnect lines that selectively connect the plurality of conductive vias.

* * * * *

UNITED STATES PATENT AND TRADEMARK OFFICE
CERTIFICATE OF CORRECTION

PATENT NO. : 6,724,611 B1
DATED : April 20, 2004
INVENTOR(S) : Mosley

It is certified that error appears in the above-identified patent and that said Letters Patent is hereby corrected as shown below:

Column 8,
Line 16, delete "plurality of" before "conductive".

Signed and Sealed this

Ninth Day of November, 2004

JON W. DUDAS
*Director of the United States Patent and Trademark Office*